US010333421B2

(12) United States Patent
Logan et al.

(10) Patent No.: US 10,333,421 B2
(45) Date of Patent: Jun. 25, 2019

(54) POLYMORPHIC WAVEFORM GENERATION

(71) Applicant: Raytheon Company, Waltham, MA (US)

(72) Inventors: Jeffery Jay Logan, Culver City, CA (US); Charles Hansen, Palos Verdes Estates, CA (US); Michael Brandon Kremer, Cambridge, MA (US); Christopher Paul Vander Valk, West Chester, OH (US); Joud Khoury, Boston, MA (US)

(73) Assignee: Raytheon Company, Waltham, MA (US)

( * ) Notice: Subject to any disclaimer, the term of this patent is extended or adjusted under 35 U.S.C. 154(b) by 159 days.

(21) Appl. No.: 15/473,909

(22) Filed: Mar. 30, 2017

(65) Prior Publication Data

US 2018/0287505 A1 Oct. 4, 2018

(51) Int. Cl.
*H02M 5/458* (2006.01)
*H03M 13/25* (2006.01)
(Continued)

(52) U.S. Cl.
CPC ........... *H02M 5/4585* (2013.01); *G01S 7/003* (2013.01); *G01S 7/023* (2013.01); *G01S 7/36* (2013.01); *G01S 13/02* (2013.01); *G01S 13/26* (2013.01); *H03M 13/255* (2013.01); *H04L 1/0001* (2013.01); *H04L 5/0046* (2013.01);
(Continued)

(58) Field of Classification Search
CPC ...... H02M 5/4585; G01S 7/003; G01S 7/023; G01S 7/36; G01S 13/02; G01S 13/26; G01S 13/90

USPC ......... 327/105-107; 370/329, 255, 230, 235, 370/392, 469, 229, 252, 332
See application file for complete search history.

(56) References Cited

U.S. PATENT DOCUMENTS 6,785,227 B1 8/2004 Lu et al.
7,024,322 B2 4/2006 Kolman et al.
(Continued)

FOREIGN PATENT DOCUMENTS

EP 1812807 B1 8/2007
WO WO-2008146046 A1 12/2008
WO WO-2018183502 A1 10/2018

OTHER PUBLICATIONS

Amuru, Saidhiraj, et al., "MIMO Radar Waveform Design to Support Spectrum Sharing", MILCOM 2013 2013 IEEE Military Communications Conference IEEE, (Nov. 18, 2013), 1535-1540.*
(Continued)

*Primary Examiner* — Tomi Skibinski
(74) *Attorney, Agent, or Firm* — Schwegman Lundberg & Woessner, P.A.

(57) ABSTRACT

Generally discussed herein are systems, devices, and methods for generating multi-function waveforms. A device can include input circuitry to receive parameters indicating respective frequencies and codes for the multi-function waveforms, one or more memories to store the respective frequencies and codes, waveform management circuitry configured to produce a series of values based on the frequencies and codes, respectively, and refine the series of values by reducing a cost associated with a waveform produced using the series of values, and a transceiver to generate the waveform.

20 Claims, 6 Drawing Sheets

(51) Int. Cl.
| | |
|---|---|
| *H04L 1/00* | (2006.01) |
| *H04L 5/00* | (2006.01) |
| *G01S 13/02* | (2006.01) |
| *H04L 25/03* | (2006.01) |
| *G01S 7/00* | (2006.01) |
| *G01S 7/02* | (2006.01) |
| *G01S 7/36* | (2006.01) |
| *G01S 13/26* | (2006.01) |
| *H04L 27/26* | (2006.01) |
| *G01S 13/90* | (2006.01) |

(52) U.S. Cl.
CPC ........ *H04L 5/0064* (2013.01); *H04L 25/0384* (2013.01); *H04L 27/2614* (2013.01); *G01S 13/90* (2013.01); *G01S 2013/0272* (2013.01)

(56) References Cited

U.S. PATENT DOCUMENTS

| | | | |
|---|---|---|---|
| 7,269,185 | B2 | 9/2007 | Kirkby et al. |
| 7,720,966 | B2 | 5/2010 | Bodin et al. |
| 8,203,942 | B2 | 6/2012 | Hernandez et al. |
| 2003/0182280 | A1 | 9/2003 | Cormack et al. |
| 2007/0150514 | A1 | 6/2007 | Chen et al. |
| 2011/0109349 | A1 | 5/2011 | Dippon et al. |
| 2012/0131199 | A1 | 5/2012 | Larkin et al. |
| 2013/0201876 | A1 | 8/2013 | Martin |

OTHER PUBLICATIONS

"International Application Serial No. PCT/US2018/024850, International Search Report dated Jun. 25, 2018", 5 pgs.

"International Application Serial No. PCT/US2018/024850, Written Opinion dated Jun. 25, 2018", 6 pgs.

Aittomaki, Tuomas, et al., "Iterative quadratic relaxation method for optimization of multiple radar waveform", IEEE International Conference on Acoustics Speech and Signal Processing ICASSP IEEE, (Mar. 20, 2016), 3036-3040.

Jakllari, Gentian, et al., "A Sync-Less Time Divided MAC Protocol for Mobile Ad-Hoc Networks", Paper ID # 901267. MILCOM, (2009), 7 pgs.

Jones, Aaron M, et al., "Eigen-space analysis of constrained adaptive radar waveform design", IEEE Radar Conference IEEE, (May 19, 2014), 829-834.

Khoury, J., et al., "An Efficient and Expressive Access Control Architecture for Content-Based Networks", Proceedings of MILCOM 2014, (Oct. 2014).

Khoury, J., et al., "Efficient Private Publish-Subscribe Systems", Proceedings of the 17th IEEE ISORC'14, (2014), 64-71.

Khoury, J., et al., "RadarMAC: Mitigating Radar Interference in Self-driving Cars", Proc. of IEEE SECON 2016, (Jun. 2016).

Lloyd, E.L., et al., "On the Complexity of Distance-2 Coloring", Proc. 4th International Conference on Computing and Information, (May 1992), 71-74.

Ramanathan, Subramanian, "A Unified Framework and Algorithm for Channel Assignment in Wireless Networks", Wireless Networks 5, (1999), 81-94.

Ramanathan, Subramanian, et al., "Scheduling Algorithms for Multihop Radio Networks", IEEE/ACM Transactions on Networking, vol. I, No. 2 (Apr. 1993), 166-177.

Ramanathan, Subramanian, et al., "Topology Control in Multihop Wireless Networks using Transmit Power Adjustment", Proc. IEEE INFOCOM '00, (2000), 10 pp.

Redi, J., et al., "JAVeLEN: An Ultra Low Energy Ad Hoc Network", Ad Hoc Networks Journal, vol. 6, Issue 1, (Jan. 2008), 108-126.

Redi, J., et al., "The DARPA WNaN network architecture", Military Communications Conference (MILCOM'11), (2011), 2258-2263.

Stoica, Petre, et al., "New Algorithms for Designing Unimodular Sequences with Good Correlation Properties", IEEE, (2008), 1-12.

Urgaonkar, R., et al., "Channel Assignment in Dense MC-MR Wireless Networks: Scaling Laws and Algorithms", Proc. IEEE INFOCOM, Turin, Italy, (Apr. 2013), 2607-2615.

Varadhan, Ravi, et al., "Squared Extrapolation Methods for Accelerating EM-Like Monotone Algorithms (SQUAREM)", (Oct. 8, 2017), 1-10.

Yu, F., et al., "Algorithms for Channel Assignment in Wireless Networks using Temporal Coloring", Proc. ACM MSWIM, Barcelona, Spain (Nov. 2013), 49-58.

\* cited by examiner

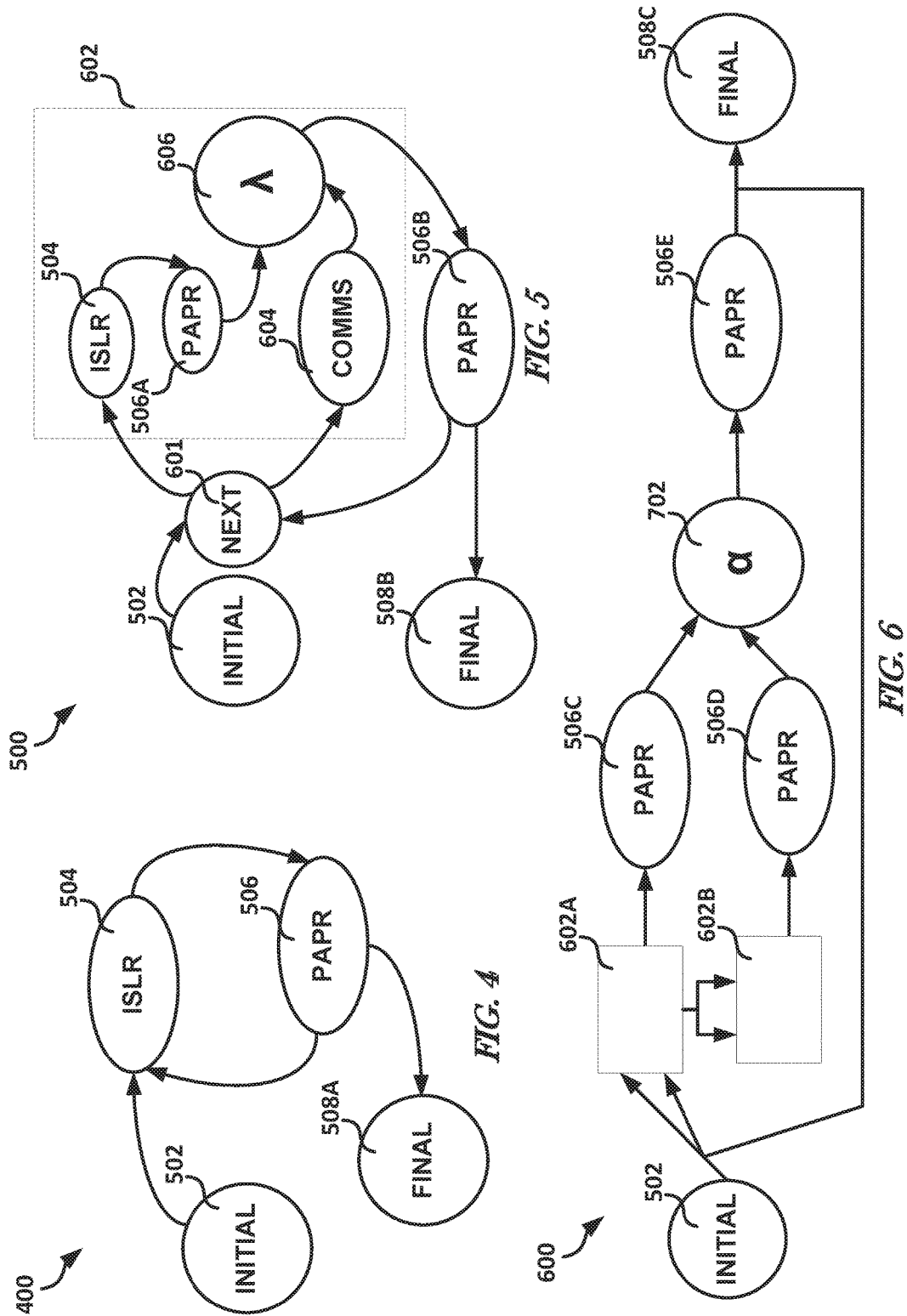

POLYMORPHIC WAVEFORM GENERATION

GOVERNMENT RIGHTS

This invention was made with Government support under Contract Number N66001-16-C-4012. The Government has certain rights in this invention.

TECHNICAL FIELD

Embodiments discussed herein relate to devices, systems, and methods for scheduling communication and/or function performance by nodes, sucl as nodes that use a same frequency, frequencies, or range of frequencies to perform communication and function operations, such as at the same time.

BACKGROUND

At a top level spectrum is highly congested. It may desired that future systems are co-designed to minimize spectral utilization and maximize co-existence between applications (e.g., commercial and/or military). Embodiments provide a waveform that provides joint radar and communication performance with a single waveform, such as while maximizing quality of service and/or providing tailor-ability to be biased towards any one function.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments or examples discussed in the present document.

FIG. 4 illustrates, by way of example, a diagram of an embodiment of a cyclic, iterative technique for reducing a cost based on two variables, such as PAPR and ISLR.

FIG. 5 illustrates, by way of example, a diagram of an embodiment of a cyclic, iterative technique for reducing a cost based on three variables, such as PAPR, ISLR, and communications error.

FIG. 6 illustrates, by way of example, a diagram of another embodiment of a cyclic, iterative technique for reducing a cost based on three variables, such as PAPR, ISLR, and communications error.

DETAILED DESCRIPTION

Figure 1:
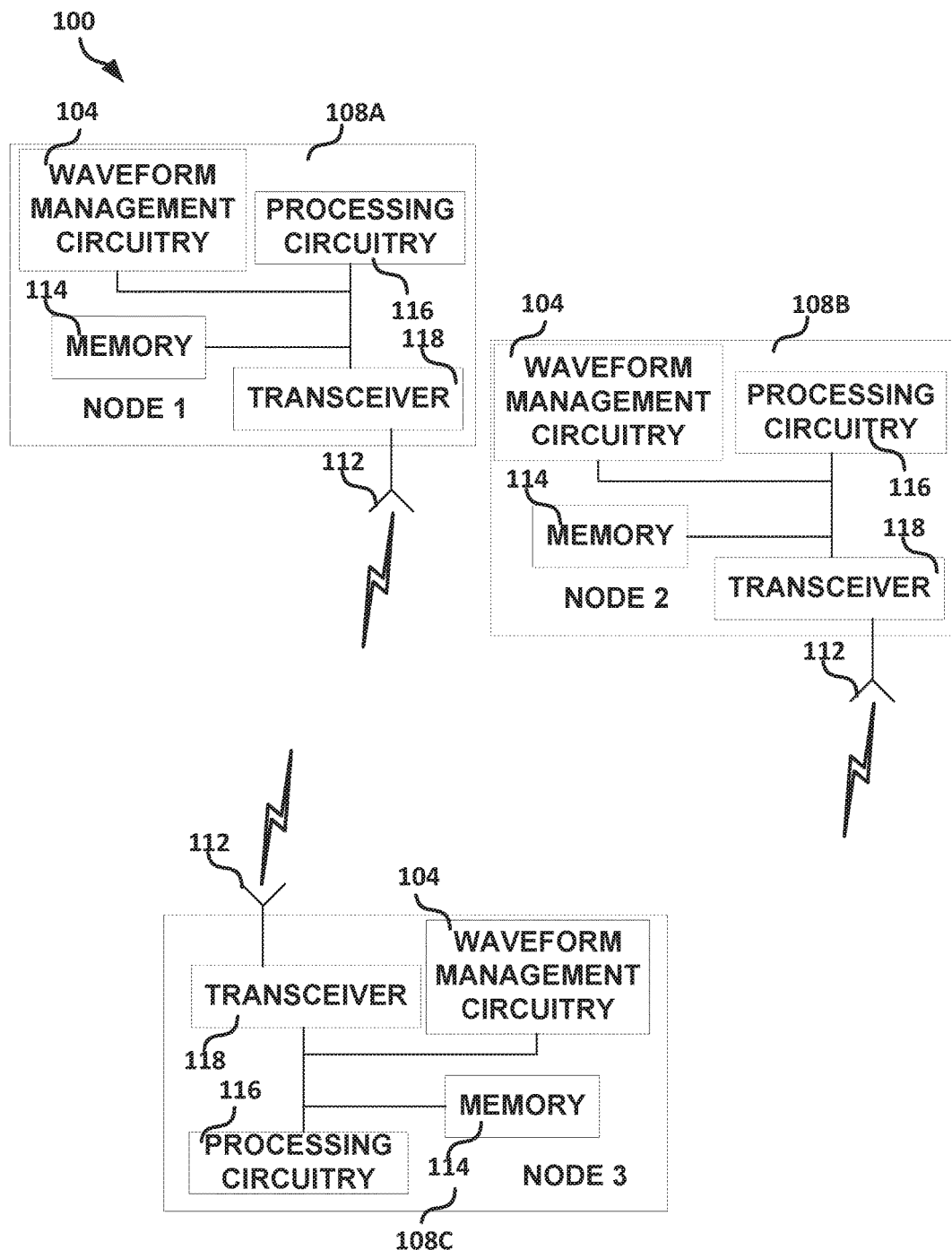
FIG. 1 illustrates, by way of example, a logical block diagram of an embodiment of a system for multi-function waveform creation.

Embodiments in this disclosure generally relate to generation of multi-function waveforms.

Consider, for example, a radar system that includes multiple radars mounted on respective unmanned aerial vehicles (UAVs). The UAVs with mounted radars, which are examples of nodes, can perform multiple functions simultaneously, such as imaging operations using a frequency or frequency band and communication of the results of the imaging operations using the same frequency or frequency band, such as simultaneously (using the same frequency and same time frame) with performing the radar operation. The communication of the results and the performance of the operations can interfere with communication and/or function performance of another node, such as a nearby node, such as may be performing the same function and/or communication. For example, performance of the function (e.g., radar imaging) of one radar device can interfere with communication of results (or other data) and/or performance of the function of another or the same radar device. Communication of the results of one radar device can interfere with communication of results or performance of the function of another or the same radar device.

Polymorphic waveforms satisfy requirements for multiple functions. These requirements are sometimes in conflict. It may be helpful to minimize or otherwise reduce conflicts between the requirements. In the example of radar and communication polymorphic waveforms, it may help to have waveforms with a low peak to average power ratio, low range side lobes, and/or useful encoding of information content. Providing a low peak to average power ratio may include reducing (e.g., minimizing) a deviation of the magnitude of the waveform from some constant value. Providing low range side lobes may include reducing (e.g., minimizing) a deviation of the waveform in frequency from some constant value and/or generating sequence(s) with low auto-correlation for non-zero offsets. Providing useful encoding information content may include reducing (e.g., minimizing) a difference between a projection of the waveform in to signal space and a desired signal vector.

Assume $z_j$ is one complex time sample in a waveform. A peak to average power will be minimized when the magnitude of the waveform in time is as close to unity as possible. Thus, minimizing peak to average power includes minimizing Equation 1:

$$\Sigma_j [z_j^* z_j - 1]^2 \qquad \text{Equation 1}$$

Assume $T_{kj}$ transforms the same samples $z_j$ in to frequencies. Minimizing range side lobes includes minimizing Equation 2:

$$\Sigma_k [\Sigma_j (T_{kj}^* z_j^*) \Sigma_j (T_{kj} z_j) - 1]^2 \qquad \text{Equation 2}$$

$T_{kj}$ may be normalized, in one or more embodiments.

Assume that $b_k$ is a desired value and $P_{kj}$ is a projection operator. Minimizing a difference between a projection of the waveform in to signal space and a desired signal vector may include minimizing Equation 3:

$$\Sigma_k [\Sigma_j) P_{kj}^* z_j^* b_k^*) \Sigma_j (P_{kj} z_j b_k)] \qquad \text{Equation 3}$$

Minimizing all three of the peak to average power, range side lobes, and a difference between the projection of the waveform in to signal space and a desired signal vector may include minimizing Equation 4 (expressed as a cost function C(z)):

$$C(z) = w_T \Sigma_j [z_j^* z_j - 1]^2 + w_R \Sigma_k [\Sigma_j (T_{kj}^* z_j) - 1]^2 + w_S \Sigma_k [\Sigma_j (P_{kj}^* z_j^* - b_k^*) \Sigma_j (T_{kj} z_j - b_k)] \qquad \text{Equation 4}$$

A first derivative of the cost function yields Equation 5:

$$C^{*(z)} = w_S \Sigma_k P_{kl} b_k^* = 2 w_R \Sigma_k ([\Sigma_j T_{kj}^* z_j^*][(\Sigma_j T_{kj}^* z_j^*) (\Sigma_j T_{kj} z_j) - 1] T_{kl}) + z_j^* [2 w_T \Sigma_l (z_l^* z_l I_{lj} - I_{lj}) + w_S (\Sigma_k P_{kl}^* P_{kj})] \qquad \text{Equation 5}$$

Determining values for the variables may include determining which values of variables that reduces the derivative of the cost function. Such a determination may be accomplished in one of a variety of ways, such as may be greedy and/or iterative. One iterative technique may include searching over all possible values of z and choosing the one that provides a cost derivative value closest to zero. Other iterative techniques may include cyclic algorithm new (CAN), spectrally efficient CAN (SECAN), spectrally efficient MISL, spectrally efficient accelerated MISL (SEMISL), and/or spectrally efficient accelerated MISL.

FIG. 1 illustrates, by way of example, a logical block diagram of an embodiment of a system 100 for distributed dynamic multi-function waveform creation using the nodes 108A-C. The system 100 as illustrated includes communicatively coupled nodes 108A, 108B, and 108C. The nodes 108A-C as illustrated each include memory 114, processing circuitry 116, waveform management circuitry 104, and one or more transceivers 118 communicatively coupled to each other. The transceivers 118 are communicatively coupled to the antennas 112.

The waveform management circuitry 104 performs operations, such as can include performing operations for determining a series of values that may be used by the node 108A-C in creating a multi-function waveform. The waveform management circuitry 104 can store parameters for creating the multi-function waveform, such as one or more weights, parameters for refining the series of values, frequencies, codes, schedule, or the like in the memory 114. In one or more embodiments, a waveform produced using a series of values provided through a schedule provided by scheduling circuitry 312 (see FIG. 2) is provided to the nodes 108A-C through one or more transmissions using the transceiver 118 and the antenna 112.

The memory 114, in one or more embodiments, comprises instructions, which when executed by the waveform management circuitry 104, cause the waveform management circuitry 104 to perform the operations detailed by the instructions. The instructions can include instructions for determining a series of values that may be converted to a waveform produced by the nodes 108A-C. In one or more embodiments, the waveform management circuitry 104 includes one or more logic gates, state machines, transistors, resistors, capacitors, inductors, multiplexors, diodes, or other circuitry configured to execute instructions (stored in the memory 114 or the waveform management circuitry 104) and perform operations based on the instructions.

The memory 114 can include data stored thereon that is provided by the processing circuitry 116, the transceiver 118, and/or the waveform management circuitry 104. The data can include data indicating parameters associated with a node ID. The data can be related such that a node ID is related to all the information corresponding to that node.

In one or more embodiments, the processing circuitry 122 can include a hardware processor, such as a central processing unit (CPU), an application specific integrated circuit (ASIC), a field programmable gate array (FPGA), and/or an arithmetic logic unit (ALU). In one or more embodiments, the processing circuitry 116 can include one or more logic gates, state machines, transistors, resistors, capacitors, inductors, multiplexors, or other circuitry (such as circuitry similar to that of the waveform management circuitry 104) configured to execute instructions and perform operations based on the instructions.

A node 108 is any device or entity that performs a function and communicates data using a same one or more frequencies. The node can include or use one or more of a sensor, a phone, an imaging device (e.g., a radar, LIDAR, camera, or the like), a satellite, a computer, a transceiver, a combination thereof, or a vehicle (e.g., a land, water, and/or aerial vehicle, such as an unmanned vehicle, such as an unmanned aerial vehicle that performs imaging using the imaging device) or other device or entity that performs a function and communicates, such as using a same one or more frequencies to communicate and perform their function.

The transceivers 118 include one or more transmit radios and/or one or more receive radios. Using the transceivers 118, the waveform management circuitry 104 can communicate data to one or more of the nodes 108A-C. The transceivers 118 can include a half-duplex and/or full duplex transceivers.

The antennas 112 are devices used to transmit and receive radio signals. Antennas are made of conductive material that radiates electromagnetic energy when provided with an electromagnetic stimulus. The antennas 112 are radiated by electromagnetic stimulus provided by the transceivers 118.

The memory 114 generally includes data stored thereon that is sufficient to convey the schedule or a subset thereof to the node 108A-C.

The processing circuitry 116 can retrieve data from the memory 114 and/or write data to the memory 114. The processing circuitry 116 can provide data to the transceiver 118 that causes the transceiver to transmit data to another node 108A-C, such as can include a node ID, side lobe configuration, a frequency or frequencies at which the node can transmit, a code or codes which the node can use to transmit, timing of performance of communication and/or function, transmit power, orientation information (such as from a sensor of the node that is part of the processing circuitry 116), future path information (information regarding a future position of the node), or other parameter of the node 108A-C.

The processing circuitry 116 may include input circuitry. The input circuitry may include a port, pad, or other electrical path through which data (e.g., one or more frequencies, codes, times, or other data regarding a time and/or data to be provided by the node 108A-C) may be provided.

The transceivers 118 convert electromagnetic radiation from the antennas 112 of another node 108A-C, or from the processing circuitry 116 of the corresponding node 108A-C, to electric signals corresponding to data to be stored in the memory 114 or used by the processing circuitry 116 to perform one or more operations.

A communication from the nodes 108A-C to other nodes 108A-C can include schedule data, such as can include an ID of the node providing the communication, a frame ID, time, time range, time offset, frequency, code, or the like.

Figure 2:
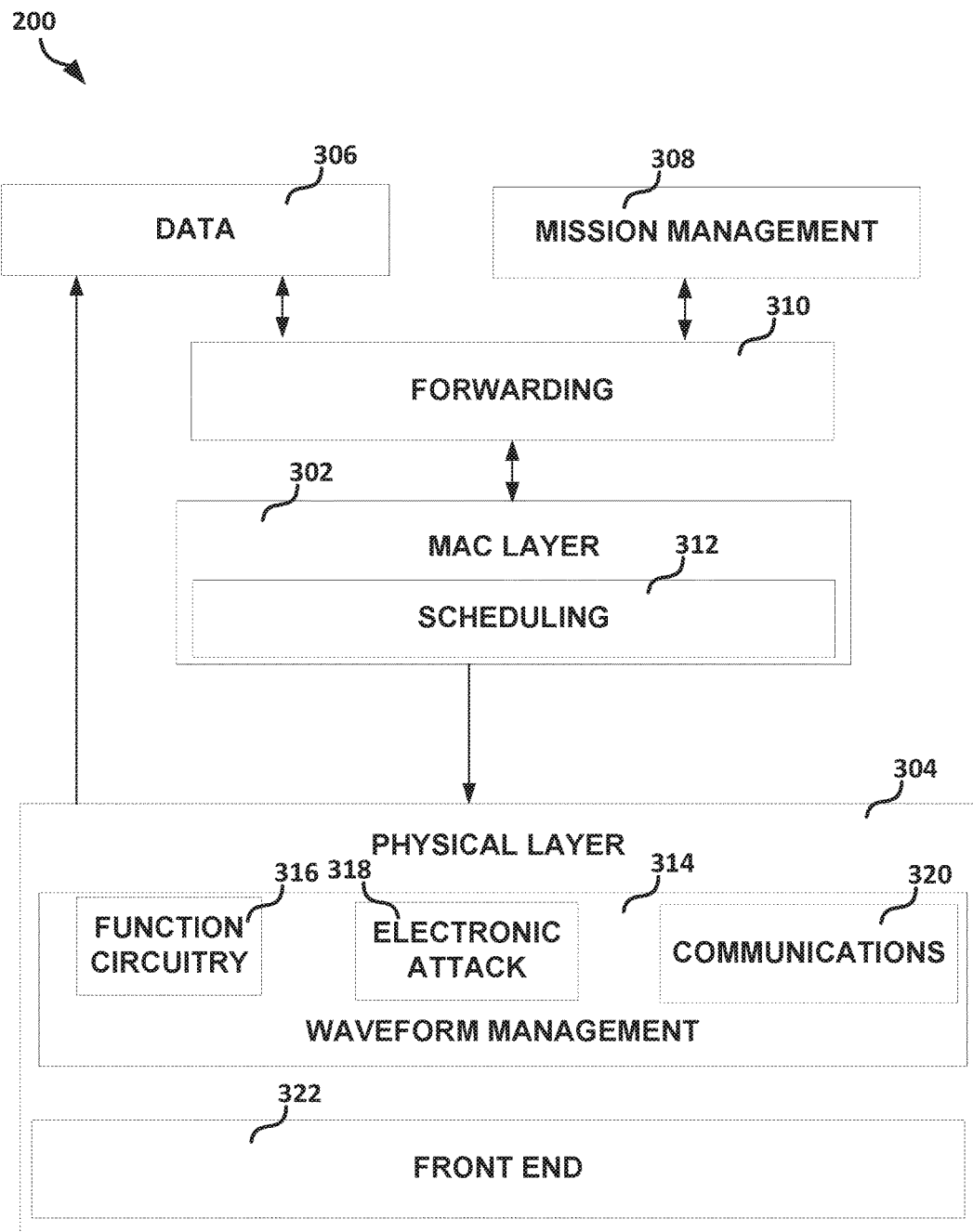
FIG. 2 illustrates, by way of example, a diagram of an embodiment of a device for determination and scheduling of a multi-function waveform.

FIG. 2 illustrates, by way of example, a diagram of an embodiment of a device 200 for determination and scheduling of a multi-function waveform. The device 200 as illustrated includes a MAC layer 302, a physical layer 304, data management circuitry 306, and mission management circuitry 308. The MAC layer 302 as illustrated includes scheduling circuitry 312. The physical layer 304 as illustrated includes function circuitry 316, electronic attack circuitry 318, communications circuitry 320, and front end circuitry 322. Each of the nodes 108A-C and/or the waveform management circuitry 104 (see FIG. 1) can include one or more of the elements of the device 200 FIG. 2, such as can include one or more elements of the MAC layer 302, one or more elements of the physical layer 304, the data management circuitry 306, and/or the mission management circuitry 308.

In the open systems interconnection (OSI) seven-layer model, the MAC layer 302 is a part of the data link layer. The MAC layer 302 is responsible for one or more of the following operations: (1) collision resolution, framing/deframing, frame header/trailer processing, checksum computation, checksum verification, and scheduling. The MAC layer 302 is in control of which entity gets control of a shared channel (e.g., one or more frequencies during a time frame)

The data management circuitry 306 receives data in the form of signals from the function circuitry 316 that get converted into actual data such as the actual radar imagery data. The data management circuitry 306 can perform one or more operations on the data for example to format the data in a form compatible with the MAC layer 302. The data management circuitry 306 can perform other operations on the data, such as can include encrypting the data, compressing the data, or the like. The data management circuitry 306 uses the same waveform that is used to perform radar in order to communicate the data to other nodes in the network. The MAC layer 302 coordinates the functions (radar imaging, communication) using the available degrees of freedom.

The mission management circuitry 308 manages parameters of nodes that share the medium controlled by the MAC layer 302. The mission management circuitry 308 can determine one or more trajectories of the nodes 108A-C (in an embodiment that includes one or more nodes that moves relative to other nodes that access the shared media controlled by the MAC layer 302). The mission management circuitry 308 can determine parameters of one or more tasks to be performed by the one or more nodes 108A-C, such as can include a function to be performed, mode in which the node is to operate, duty cycle (as a function of time), parameters of the function to be performed (frequency or frequencies to be used, timing of performing the function, or the like), and communication latency (an amount of time it will take for a communication to originate at one node and travel to a same or another node), such as can be based on the determined trajectories, positions of the nodes 108A-C, among other parameters that can be determined by the mission management circuitry 308. The mission management circuitry 308 can determine priorities for one or more of the nodes 108A-C, such as to aid in conflict resolution and/or aid in determination of a definite schedule.

The forwarding circuitry 310 manages routing of communications. The forwarding circuitry 310 can perform routing over multiple hops, such as to fulfill one or more of traffic demand (demand by a node to access the shared medium), communication latency, and/or node priority.

The scheduling circuitry 312 allocates available slots of the medium to nodes that share the medium. The scheduling circuitry 312 can allocate a slot based on available degrees of freedom. The allocation can be determined by solving a joint constraints problem (e.g., considering the constraints of each of the nodes that request access to or otherwise communicate over the shared medium) based on available degrees of freedom. The degrees of freedom can include spectral bandwidth available, spatial bandwidth available, and/or temporal bandwidth available. The constraints can include temporal, spatial, and/or spectral constraints. Based on the degrees of freedom and the constraints, the scheduling circuitry 312 can allocate slots in the medium. The allocation of slots is discussed in more detail with regard to the section titled "scheduling considerations" among others.

The waveform management circuitry 314 synthesizes a polymorphic waveform. The polymorphic waveform can be synthesized based on inputs and resource availability, sometimes referred to as waveform parameters. The parameters may include temporal, spatial, spectral, function, mode, trajectory, duty cycle, communication latency, side lobe configuration, code, or other parameter. The waveform management circuitry 314 is further described with regard to FIGS. 3-4. The waveform management circuitry 314 can include elements and perform operations of the waveform management circuitry 104.

The physical layer 304 includes networking hardware, such as one or more of a receiver, transmitter, transceiver, router, gateway, bridge, modem, wireless access point, line driver, switch, hub, repeater, network interface controller, or the like. The physical layer 304 defines how bits are to be transmitted (rather than packets as in the MAC layer 302) are transmitted between nodes 108A-C. The bits can be converted to a word or symbol, converted to a waveform or signal, and transmitted using the hardware. The physical layer translates requests from the data link layer (e.g., the MAC layer 302) to hardware operations that fulfill those requests in the form of transmission or reception of signals using the hardware.

The function circuitry 316 includes hardware to perform a function of the node. The function can include imaging, such that the hardware includes a radar.

The electronic attack circuitry 318 can aid in performing another function, such as detecting jamming, or other electronic attack, on the node. Jamming is impairing the use or altering the use of an electronic device by radiating, reradiating, or reflecting electromagnetic energy. Jamming techniques, in an example of radar, can include amplifying a portion of a signal, cross polarization, circular polarization, barrage noise jamming, asynchronous pulsed jamming, angle jamming, among others. The electronic attack circuitry 318 can help detect whether jamming is occurring and take countermeasures to help ensure that the jamming is ineffective and the radar. For example, beam-to-beam correlation can be used to help reject pulse jamming and/or jamming at a swept frequency.

The communications circuitry 320 can provide an ability to perform a communication function. The communications circuitry 320 can include one or more of one or more receivers, transmitters, and/or transceivers, power amplifiers, modulators, demodulators, analog to digital converters, digital to analog converters, antennas, spread spectrum components, encoders, decoders, or the like. The communications circuitry 320 can receive and/or transmit electromagnetic energy from and/or to other nodes or itself (such as in the example of radar or other reflected electromagnetic wave technology).

The waveform management circuitry 314 can generate a single waveform to satisfy demands from upper layers. The operations of the function circuitry 316 (e.g., radar 316), electronic attack circuitry 318, and/or communications circuitry 320 can all be performed by a polymorphic waveform.

The front end circuitry 322 is the hardware which can include an antenna or antenna array.

In terms of radar function, a function conflict means that between radar devices m and n, a pulse from one radar device interferes with a return pulse from the other radar device. Eclipsing occurs when the transmission from node m to node n is eclipsed at node n, i.e., it arrives at node n while node n is transmitting. Hence, node n is unable to receive the transmission from in because it does not have the capability to transmit and receive at the same time. The scheduling circuitry 312 can solve this problem by scheduling the transmission from m so that it arrives at n while the latter is listening (not transmitting) accounting for the signal time of flight between m and n. Eclipsing can be avoided by allocating time offsets (e.g., by the scheduling circuitry 312) correctly. Assuming that nodes i and j are synchronized relative to a time reference and have same pulse repetition frequency (PRF), then for a pulse width, tau, the range (distance between i and j) divided by the speed of the transmission signal, c, should be greater than tau. The scheduling circuitry 312 sets the time offsets to ensure this constraint is addressed.

Figure 3:
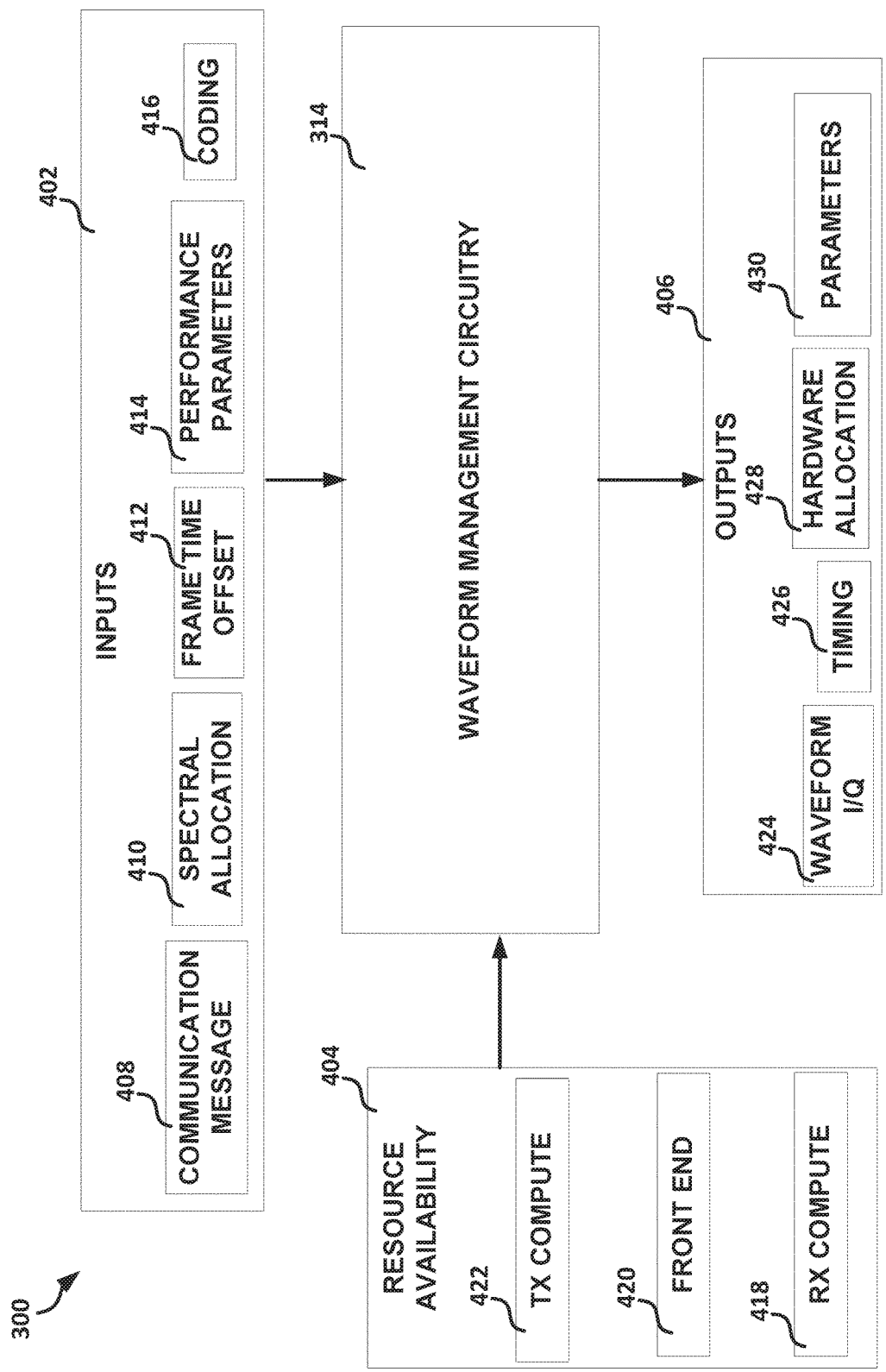
FIG. 3 illustrates, by way of example, a block diagram of an embodiment of a waveform management system.

FIG. 3 illustrates, by way of example, a block diagram of an embodiment of a waveform management system 300. The waveform management system 300 as illustrated includes inputs 402, resource availability data 404, the waveform management circuitry 314, and the outputs 406. The inputs 402 and/or the resource availability data 404 may be used by the waveform management circuitry 314 in providing the outputs 406.

The inputs 402 as illustrated include a communication message 408, spectral allocation 410, frame time offset 412, performance parameters 414, and coding 416. The communication message 408 may be a message between nodes 108A-C or a message between a node 108A-C and the waveform management circuitry 104. The communication message 408 may include data indicating values for other inputs 402.

The spectral allocation 410 may include a frequency or frequencies with which the node 108A-C may perform multiple functions. The frame time offset 412 is a time between transmission and reception in the node 108A-C performing a function. In radar, the frame time offset 412 may be between the time a radar signal is transmitted and a time a reflected signal is received.

The performance parameters 414 may include image resolution (e.g., of a radar image), expectations of a mission being performed by the nodes 108A-C, a throughput of the system 300, or other performance need. The coding 416 may include codes used for code division multiple access (CDMA). CDMA is a channel access method in which several transmitters can provide information simultaneously over a single channel.

The resource availability data 404 as illustrated includes a receive compute availability 418, a front end availability 420 (e.g., an availability of the front end 322), and a transmit compute availability 422. The receive compute availability 418 indicates compute resources that are available for performing signal processing for decoding of a polymorphic waveform, such as from another node. The front end availability 420 indicates ability of radio frequency (RF) circuitry (e.g., the transceiver 118 and/or the processing circuitry 116) to send or receive a waveform at desired time and/or frequency. The transmit compute availability 422 indicates compute resources that are available for performing signal processing for encoding of a polymorphic waveform, such as provided from the waveform management circuitry 314/104.

The outputs 406 as illustrated include waveform I/Q 424, a timing 426 at which the waveform is to be transmitted, and a hardware allocation 428. The waveform I/Q 424 includes information regarding a phase and/or amplitude of a waveform to be produced. The timing 426 may be produced by the scheduling circuitry 312. The timing 426 may indicate a time at which a waveform of amplitude and phase indicated by the waveform I/Q 424 is to be transmitted. The hardware allocation 428 indicates what hardware of the node is to be used in execution of the waveform provided by the node 108A-C.

The waveform management circuitry 314 may produce parameters 430 (e.g., values for $z_j$, $T_{kj}$, $P_{kj}$, $b_k$, $w_T$, $w_R$, and/or $w_S$), constrained by the inputs 402 and the resource availability data 404. The waveform management circuitry 314 may perform operations to reduce Equation 4 and/or Equation 5, such as can be constrained by the inputs 402 and/or the resource availability data 404.

The waveform management circuitry 314 may implement an iterative, cyclic technique in reducing a cost function, such as may include a cost associated with side lobe levels (integrated side lobe level ratio (ISLR)), peak to average power ratio (PAPR), and/or an error rate.

FIG. 4 illustrates, by way of example, a diagram of an embodiment of a cyclic, iterative technique 400 for reducing a cost based on two variables, such as PAPR and ISLR. The technique 400 may be performed by the waveform management circuitry 104. The technique 400 includes initializing variables, at operation 502. The variables may include one or more of $z_j$, $T_{kj}$, $P_{kj}$, $b_k$, $W_T$, $W_R$, and/or $w_S$. The operation 502 may include randomly generating values for one or more of the variables. The operation 502 may include setting the values of one or more of the variables to a previously determined value, or a value for the variable(s) otherwise known to be a guess for the value of the variable. The operation 504 determines the $z_j$ values that provide a minimum ISLR based on a constraint that $|z_j|=x$ for if variables fixed at their initial value, where x may be a real number, such as one (1). The operation 506 determines $z_j$ values that provide an improved PAPR, such as a PAPR closer one, constrained by the values determined at operation 504. The operation 506 may include clipping a maximum value in the series of values produces after operation 504. Those values are then fed back to operation 504 and the process repeats for a specified number of iterations and/or until the $z_j$ value produced provide a PAPR and/or ISLR that are greater than, less than, or equal to, a specified PAPR, ISLR or delta threshold. A delta threshold specifies a minimum threshold change between $z_j$ values produced in consecutive iterations. A PAPR threshold defines an acceptable PAPR value, and an ISLR threshold defines an acceptable ISLR. The number of iterations may be set based on compute capability, time constraints, a desire for an optimal, versus an acceptable polymorphic waveform, or the like. For example, fewer iterations may be used in embodiments in which more interference between polymorphic waveforms is acceptable. In another example, more iterations may be used in embodiments in which less interference between polymorphic waveforms is acceptable. After the number of iterations have been performed, the technique 400 may finish at operation 508A, with a refined series of values being provided to PHY circuitry of the node 108A-C.

FIG. 5 illustrates, by way of example, a diagram of an embodiment of a cyclic, iterative technique 500 for reducing a cost based on three variables, such as PAPR, ISLR, and communications error. The technique 500 may be performed by the waveform management circuitry 104. The technique 500 may be referred to as a spectrally efficient cyclic, iterative technique. Spectrally efficient because the frequency content of the final series of values is altered based on spectral content desired in the final series of values, such as at operation 604. The technique 500 as illustrated includes some operations that are the same as an operation of the technique 400. The operation 502 includes initialization as previously discussed with regard to FIG. 4.

The operation 601 includes providing a next series of values $z_j$ to each of the operations 504 and 604. The next series of values includes the initial values the first iteration and the series of values provided by operation 506B for iterations thereafter. The series of values from the next operation 601 are provided to the operation 504 and the operation 604. The operations 504 and 506A were previously discussed with regard to operations 504 and 506 of FIG. 4. The operation 604 may include performing a dot product operation between a vector that is the series of values from the next operation 601 and another vector that is a series of weights to alter frequency content of the polymorphic waveform generated by the waveform management circuitry 314 (e.g., generated based on the series of values produced at operation 508). The operations in the dashed box labeled 602 are referenced in in the description of FIG. 6 as specific embodiments 602A and 602B.

Operation 606 includes combining the series of values produced by the operation 604 and the operation 506A. The operation 606 may include multiplying the series of values from the operation 506A by a first constant, multiplying the series of values from the operation 604 by a second constant, and adding the results of the two multiplications. In one or more embodiments, the first and second constants may add to a sum of one. In one or more embodiments, the first and second constants may include one or more of $\lambda$ and $(1-\lambda)$, respectively. The series of values produced by the operation 606 may be provided to the operation 506B. The operation 506B is the same as the operation 506, but performed on a series of values from the operation 606. The values from the operation 506B are (1) provided to the operation 601 if there are more iterations to be performed, or (2) provided as the final series of values at operation 508B if there are no more iterations to be performed.

FIG. 6 illustrates, by way of example, a diagram of another embodiment of a cyclic, iterative technique 600 for reducing a cost based on three variables, such as PAPR, ISLR, and communications error. The technique 600 may be referred to as an accelerated spectrally efficient cyclic, iterative technique. Spectrally efficient because the frequency content of the final series of values is altered based on spectral content desired in the final series of values, such as at operation 604 of FIG. 5. Accelerated because the technique 600 may converge to an optimal solution (based on the parameters provided, such as discussed with regard to FIG. 3) faster than the techniques 400 and/or 500. The technique 600 as illustrated includes some operations that are the same as an operation of the technique 400 and/or 500. The operation 502 includes initialization as previously discussed with regard to FIG. 4.

An operation 602A includes performing the operations 504, 506A, 604, and 606 as shown and discussed with regard to FIG. 5 (at the dashed box labelled 602). The series of values produced by the operation 602A are provided to the operation 506C and the operation 602B. The operation 602B includes performing the operations 504, 506A, 604, and 606 as shown and discussed with regard to FIG. 5, but using the series of values from the operation 602A as input to the operation 602B. The operations 506C and 506D were previously discussed with regard to operation 506 of FIG. 4. The series of values produced from the operation 506C and the series of values produced from the operation 506D may be provided to operation 702. The operation 702 truly include combining the series of values from each of the operations 506C and 506D. The operation 702 may include multiplying the series of values from the operation 506C by a first constant, multiplying the series of values from the operation 506D by a second constant, and adding the results of the two multiplications. In one or more embodiments, the first and second constants may add to a sum of one. In one or more embodiments, the first and second constants may include one or more of $\alpha$ and $(1-\alpha)$, respectively. The series of values produced by the operation 702 may be provided to the operation 506E. The, operation 506E is the same as the operation 506, but performed on a series of values from the operation 702. The values from the operation 506E are (1) provided to the operation 602A if there are more iterations to be performed, or (2) provided as the final series of values at operation 508C if there are no more iterations to be performed.

Figure 7:
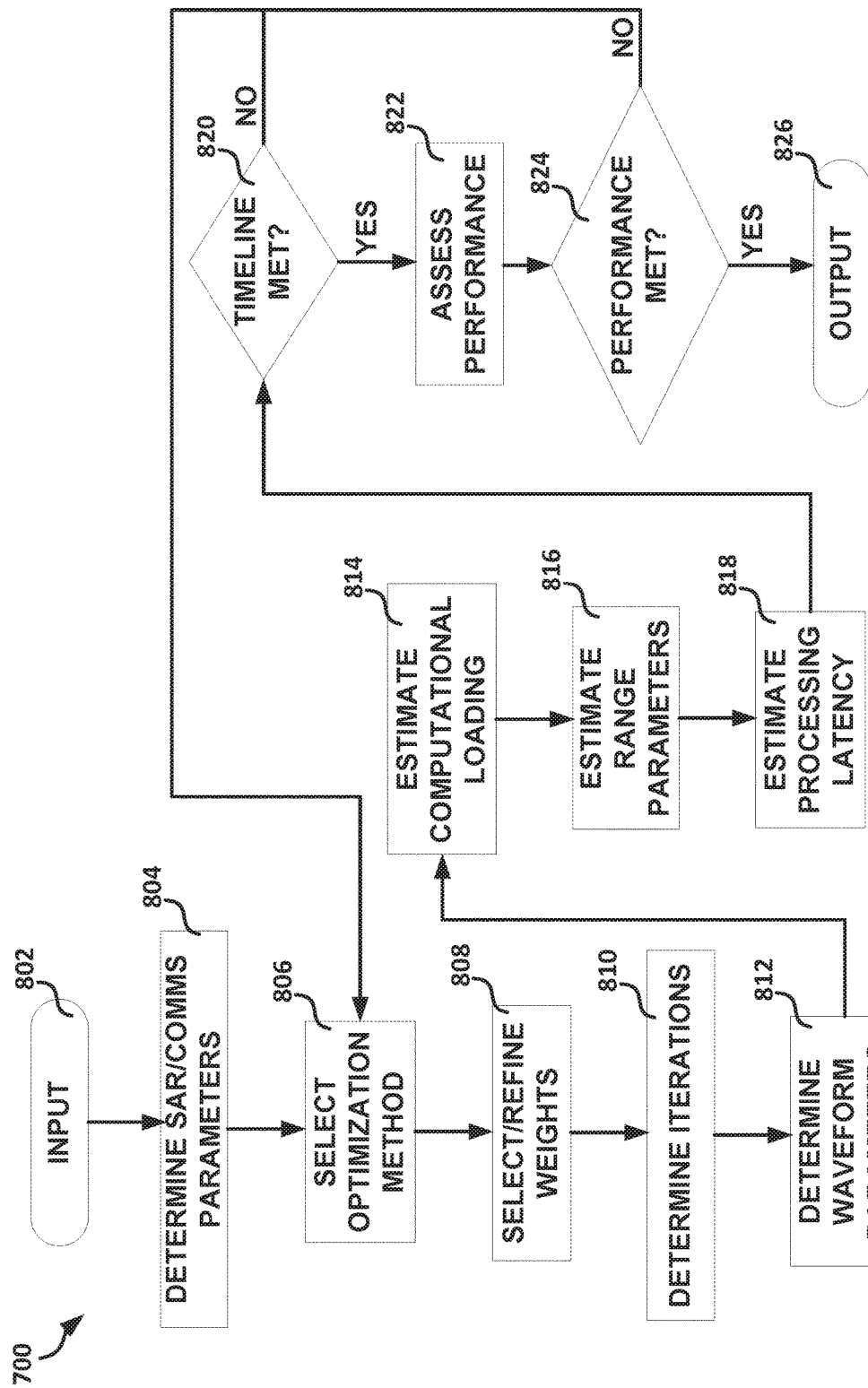
FIG. 7 illustrates, by way of example, a flow diagram of an embodiment of a method.

FIG. 7 illustrates, by way of example, a flow diagram of an embodiment of a method 700. The method may be implemented by the waveform management circuitry 314. The method 700 as illustrated includes receiving input, at operation 802; determining synthetic aperture radar (SAR) and/or communications (COMMS) parameters, at operation 804; selecting an optimization method, at operation 806; select/refine weights, at operation 808; determining a number of iterations, at operation 810; determining waveform parameters, at operation 812; estimating computational loading, at operation 814; estimating range parameters, at operation 816; estimating processing latency, at operation 818; determining whether a timeline is met, at operation 820; assessing performance, at operation 822 when the timeline is met; determining whether performance is met, at operation 824; and providing output, at operation 826 when the performance is met. If either of the timeline or performance is not met, the method returns to selection of an optimization method at step 806.

The input(s) at operation 802 may include one or more of the inputs 4 02 and/or the resource availability data 404. The SAR/COMMS parameters determined at operation 804 may be based on the inputs received at operation 802. For example, the inputs may indicate that radar imaging of a specific minimum contrast is required, to provide communications message payload, or the like. The SAR/COMMS parameters determined at operation 804 may include the minimum ISLR required for sufficient SAR imaging contrast, maximum PAPR limit set by RF front-end performance, and acceptable distortion I effective transmit signal-to-noise ratio (SNR) for achieving an error rate (bit error rate (BER) target.

The operation 806 may include choosing between one of the methods discussed with regard to FIGS. 4-6. The operation 806 may include, determining the optimization method based on the resource availability data 404, as provided at the operation 802. For example, the technique 400 may be less computationally intensive than the methods 500 and/or 600 but may take more iterations/time to converge to an acceptable level of communications/function performance. The method 600 may require more resources than the method 500, but may converge to an acceptable level of communications/function performance in less time than the other techniques 400-500. Thus, if more time and fewer compute resources are available, one of the techniques 400 and 500 may be chosen. If less time and more compute resources are available, the method 500 or 600 may be chosen.

The weights selected/refined at operation 808 may include $w_S$, $w_R$, $w_T$, or other parameter discussed with regard to the cost function or the change in the cost function (the derivative of the cost function). The selected weights at operation 808 may vary or be constant. In one or more embodiments, the selected weights may be adjusted based on the input(s) 802. For example, a weight associated with communications may be increased in response to input indicating that relaying a message is a highest/higher priority. In another example, a weight associated with PAPR or ISLR may be increased in response to input indicating that generating a radar image is a highest/higher priority.

The number of iterations determined at operation 810 may be determined based on the resource availability data 404 and/or the optimization method selected at operation 806. For example, if the optimization method selected is either of the techniques 400 and 500, the number of iterations may be greater than if the method 600 is selected.

The operation 812 may include selecting waveform parameters such as the length of the sequence to be generated and the pulse repetition frequency. The values are selected to meet the system performance needs and hardware constraints provided by 802. For example, the RF front end may be duty cycle limited.

The operation 814 may include estimating a computational load on a node in producing a waveform in accord with the determined waveform parameters. The computational loading can be determined based on the selected optimization method 806, number of iterations 810, and waveform parameters (such as sequence length) 812. The operation 816 may include estimating the range of a waveform that includes the parameters determined at operations 804 and 812. The operation 818 may include determining how long it will take the node to produce the waveform that includes the parameters determined in the prior operations.

The operation 820 may include determining whether the latency determined at operation 818 creates a problem with a schedule for the nodes. The schedule for the node may be determined, in one or more embodiments, as disclosed in the U.S. patent application Ser. No. 15/385,821, titled "Scheduling Access to a Shared Medium", and filed on Dec. 20, 2016, which is incorporated herein by reference in its entirety. If the timeline is not met, the method 800 may continue at operation 806. If the timeline is met, the method may continue at operation 822.

Assessing the performance at operation 822 may include if the generated waveform conforms to the communications and/or radar and/or EW performance needs determined at operation 804. If it is determined at operation 824 that the performance is not met, the method 800 may continue at operation 806. If the performance is met, the determined parameters may be provided to the nodes as output at operation 826.

Figure 8:
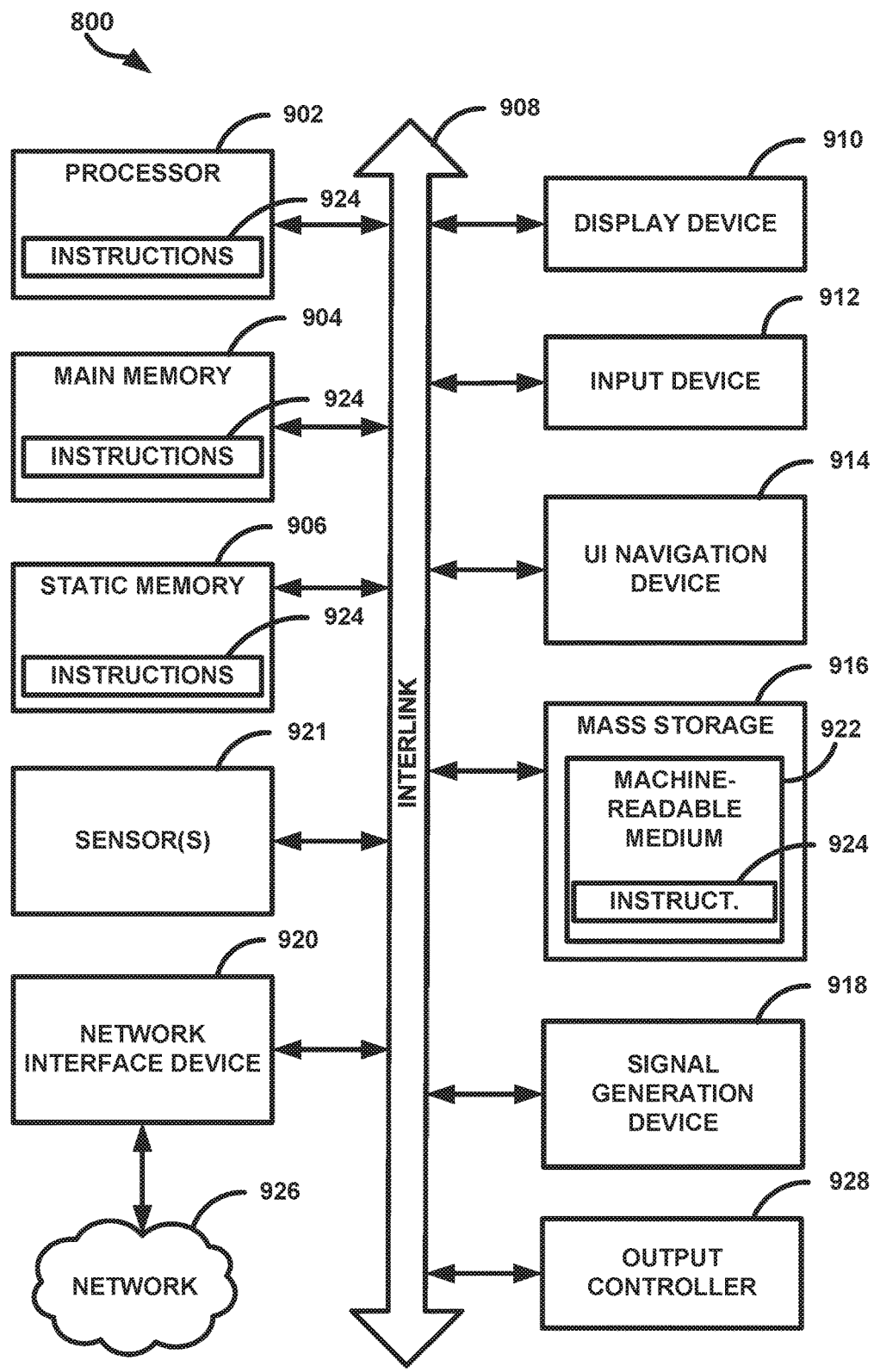
FIG. 8 illustrates, by way of example, a block diagram of an embodiment of a machine on which one or more of the methods as discussed herein can be implemented.

FIG. 8 illustrates, by way of example, a block diagram of an embodiment of a machine 800 on which one or more of the methods as discussed herein can be implemented. In one or more embodiments, one or more items of the waveform management circuitry 104 and/or the nodes 108A-C can be implemented by the machine 800. In alternative embodiments, the machine 800 operates as a standalone device or may be connected (e.g., networked) to other machines. In one or more embodiments, the waveform management circuitry 104/314 and/or the nodes 108A-C can include one or more of the items of the machine 800. In a networked deployment, the machine 800 may operate in the capacity of a server or a client machine in server-client network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example machine 800 includes processing circuitry 902 (e.g., a central processing unit (CPU), a graphics processing unit (GPU), an application specific integrated circuit, circuitry, such as one or more transistors, resistors, capacitors, inductors, diodes, logic gates, multiplexers, buffers, modulators, demodulators, radios (e.g., transmit or receive radios or transceivers), sensors 921 (e.g., a transducer that converts one form of energy (e.g., light, heat, electrical, mechanical, or other energy) to another form of energy), or the like, or a combination thereof), a main memory 904 and a static memory 906, which communicate with each other via a bus 908. The machine 800 (e.g., computer system) may further include a video display unit 910 (e.g., a liquid crystal display (LCD) or a cathode ray tube (CRT)). The machine 800 also includes an alphanumeric input device 912 (e.g., a keyboard), a user interface (UI) navigation device 914 (e.g., a mouse), a disk drive or mass storage unit 916, a signal generation device 918 (e.g., a speaker) and a network interface device 920.

The disk drive unit 916 includes a machine-readable medium 922 on which is stored one or more sets of instructions and data structures (e.g., software) 924 embodying or utilized by any one or more of the methodologies or functions described herein. The instructions 924 may also reside, completely or at least partially, within the main memory 904 and/or within the processor 902 during execution thereof by the machine 800, the main memory 904 and the processor 902 also constituting machine-readable media.

The machine 800 as illustrated includes an output controller 928. The output controller 928 manages data flow to/from the machine 800. The output controller 928 is sometimes called a device controller, with software that directly interacts with the output controller 928 being called a device driver.

While the machine-readable medium 922 is shown in an example embodiment to be a single medium, the term "machine-readable medium" may include a single medium or multiple media (e.g., a centralized or distributed database, and/or associated caches and servers) that store the one or more instructions or data structures. The term "machine-readable medium" shall also be taken to include any tangible medium that is capable of storing, encoding or carrying instructions for execution by the machine and that cause the machine to perform any one or more of the methodologies of the present invention, or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including by way of example semiconductor memory devices, e.g., Erasable Programmable Read-Only Memory (EPROM), Electrically Erasable Programmable Read-Only Memory (EEPROM), and flash memory devices; magnetic disks such as internal hard disks and removable disks; magneto-optical disks; and CD-ROM and DVD-ROM disks.

The instructions 924 may further be transmitted or received over a communications network 926 using a transmission medium. The instructions 924 may be transmitted using the network interface device 920 and any one of a number of well-known transfer protocols (e.g., HTTP). Examples of communication networks include a local area network ("LAN"), a wide area network ("WAN"), the Internet, mobile telephone networks, Plain Old Telephone (POTS) networks, and wireless data networks (e.g., WiFi and WiMax networks). The term "transmission medium" shall be taken to include any intangible medium that is capable of storing, encoding or carrying instructions for execution by the machine, and includes digital or analog communications signals or other intangible media to facilitate communication of such software.

As used herein, "communicatively coupled between" means that the entities on either of the coupling must communicate through an item therebetween and that those entities cannot communicate with each other without communicating through the item.

EXAMPLES AND ADDITIONAL NOTES

Example 1 can include a device configured to create multi-function waveforms comprising input circuitry to receive parameters indicating respective frequencies and codes for the multi-function waveforms, one or more memories to store the respective frequencies and codes, waveform management circuitry, the waveform management circuitry configured to produce a series of values based on the frequencies and codes, respectively, and refine the series of values by reducing a cost associated with a waveform produced using the series of values, and a transceiver to generate the waveform.

In Example 2, Example 1 can further include, wherein the cost includes a combination of two or more of a peak to average power ratio of the series of values, a side lobe level of the series of values, and a difference between a projection of the waveform in to signal space and a desired signal vector.

In Example 3, Example 2 can further include, wherein the cost function includes a sum of all three of the peak to average power ratio of the series of values, the side lobe level of the series of values, and the difference between a projection of the waveform in to signal space and a desired signal vector.

In Example 4, Example 3 can further include, wherein refining the series of values includes performing one of a spectrally efficient, iterative technique or a spectrally efficient, accelerated iterative technique.

In Example 5, at least one of Examples 1-4 can further include, wherein the waveform management circuitry is further to determine a number of iterations to perform in refining the series of values based on the technique used to refine the series of values.

In Example 6, Example 5 can further include, wherein the determined number of iterations is fewer for a spectrally efficient, accelerated iterative technique than for a spectrally efficient, iterative technique.

In Example 7, at least one of Examples 1-6 can further include, wherein the waveform management circuitry is further to estimate a processing latency associated with the node producing the waveform based on the refined series of values.

In Example 8, Example 7 can further include, wherein the one or more memories is further to store a schedule indicating times at which nodes of a network of nodes are to produce the multi-function waveforms, and the waveform management circuitry is further to determine whether the estimated processing circuitry creates a conflict in the schedule.

In Example 9, Example 8 can further include, wherein the each of the average power ratio of the series of values, the side lobe level of the series of values, and the difference between a projection of the waveform in to signal space and a desired signal vector are multiplied by a respective weight.

In Example 10, at least one of Examples 1-9 can further include, wherein the cost function includes:

$$C(z) = w_T \Sigma_j [z_j^* z_j - 1]^2 + w_R \Sigma_k [\Sigma_j (T_{kj}^* z_j^*) \Sigma_j (T_{kj} z_j) - 1]^2 + w_S \Sigma_k [\Sigma_j (P_{kj}^* z_j^* - b_k^*) \Sigma_j (T_{kj} z_j - b_k)]$$

where $w_T$, $w_R$, and $w_S$ are weights for the peak to average power ratio, side lobe level, and the a difference between a projection of the waveform in to signal space and a desired signal vector, $z_j$ is a complex value of the series of values, * indicate the complex conjugate, $T_{kj}$ transforms the same samples $z_j$ in to frequencies, $b_k$ is a desired value, and $P_{kj}$ is a projection operator.

Example 11 can include a method for generating multi-function waveforms comprising receiving, from scheduling circuitry, parameters indicating respective frequencies and codes for the multi-function waveforms, producing, by waveform management circuitry, a series of values based on a frequency and code of the frequencies and codes, respectively, refining, by the waveform management circuitry, the series of values by reducing a cost associated with producing the series of values, and providing, by a transceiver coupled to the waveform management circuitry, a waveform based on the refined series of values.

In Example 12, Example 11 can further include, wherein the cost function includes a combination of two or more of a peak to average power ratio of the series of values, a side lobe level of the series of values, and a difference between a projection of the waveform in to signal space and a desired signal vector.

In Example 13, Example 12 can further include, wherein the cost function includes a sum of all three of the peak to average power ratio of the series of values, the side lobe level of the series of values, and the difference between a projection of the waveform in to signal space and a desired signal vector.

in Example 14, at least one of Examples 11-13 can further include, wherein refining the series of values includes performing one of a spectrally efficient, iterative technique or a spectrally efficient, accelerated iterative technique.

In Example 15, at least one of Example 11-14 can further include determining a number of iterations to perform in refining the series of values based on the technique used to refine the series of values.

In Example 16, Example 15 can further include, wherein the determined number of iterations is fewer for a spectrally efficient, accelerated iterative technique than for a spectrally efficient, iterative technique.

In Example 17, at least one of Examples 11-16 can further include estimating a processing latency associated with the node producing the waveform based on the refined series of values.

In Example 18, Example 17 can further include determining whether the estimated processing latency creates a conflict in a schedule indicating times at which nodes of a network of nodes are to produce the multi-function waveforms.

In Example 19, Example 18 can further include, wherein the each of the average power ratio of the series of values, the side lobe level of the series of values, and the difference between a projection of the waveform in to signal space and a desired signal vector are multiplied by a respective weight.

In Example 20, Example 19 can further include, wherein the cost function includes:

$$C(z) = w_T \Sigma_j [z_j^* z_j - 1]^2 + w_R \Sigma_k [\Sigma_j (T_{kj}^* z_j^*) \Sigma_j (T_{kj} z_j) - 1]^2 + w_S \Sigma_k [\Sigma_j (P_{kj}^* z_j^* - b_k^*) \Sigma_j (T_{kj} z_j - b_k)]$$

where $w_T$, $w_R$, and $w_S$ are weights for the peak to average power ratio, side lobe level, and the a difference between a projection of the waveform in to signal space and a desired signal vector, $z_j$ is a complex value of the series of values, * indicate the complex conjugate, $T_{kj}$ transforms the same samples $z_j$ in to frequencies, $b_k$ is a desired value, and $P_{kj}$ is a projection operator.

Example 21 can include a non-transitory machine-readable medium including instructions stored thereon which, when executed by a machine, cause the machine to perform operations comprising receiving, from scheduling circuitry, parameters indicating respective frequencies and codes for the multi-function waveforms, producing a series of values based on a frequency and code of the frequencies and codes, respectively, refining the series of values by reducing a cost associated with producing the series of values, and providing a waveform based on the refined series of values.

In Example 22, Example 21 can further include, wherein the cost function includes a combination of two or more of a peak to average power ratio of the series of values, a side lobe level of the series of values, and a difference between a projection of the waveform in to signal space and a desired signal vector.

In Example 23, Example 22 can further include, wherein the cost function includes a sum of all three of the peak to average power ratio of the series of values, the side lobe level of the series of values, and the difference between a projection of the waveform in to signal space and a desired signal vector.

In Example 24, Example 23 can further include, wherein each of the average power ratio of the series of values, the side lobe level of the series of values, and the difference between a projection of the waveform in to signal space and a desired signal vector are multiplied by a respective weight.

In Example 25, at least one of Examples 21-24 can further include, wherein the cost function includes:

$$C(z) = w_T \Sigma_j [z_j^* z_j - 1]^2 + w_R \Sigma_k [\Sigma_j (T_{kj}^* z_j^*) \Sigma_j (T_{kj} z_j) - 1]^2 + w_S \Sigma_k [\Sigma_j (P_{kj}^* z_j^* - b_k^*) \Sigma_j (T_{kj} z_j - b_k)]$$

where $w_T$, $w_R$, and $w_S$ are weights for the peak to average power ratio, side lobe level, and the a difference between a projection of the waveform in to signal space and a desired signal vector, $z_j$ is a complex value of the series of values, * indicate the complex conjugate, $T_{kj}$ transforms the same samples $z_j$ in to frequencies, $b_k$ is a desired value, and $P_{kj}$ is a projection operator.

in Example 26, at least one of Examples 21-25 can further include, wherein refining the series of values includes performing one of a spectrally efficient, iterative technique or a spectrally efficient, accelerated iterative technique.

In Example 27, at least one of Examples 21-26 can further include, wherein the operations further comprise determining a number of iterations to perform in refining the series of values based on the technique used to refine the series of values.

In Example 28, Example 27 can further include, wherein the determined number of iterations is fewer for a spectrally efficient, accelerated iterative technique than for a spectrally efficient, iterative technique.

In Example 29, at least one of Examples 21-28 can further include, wherein the operations further comprise estimating a processing latency associated with the node producing the waveform based on the refined series of values.

In Example 30, Example 29 can further include, wherein the operations further comprise determining whether the estimated processing latency creates a conflict in a schedule indicating times at which nodes of a network of nodes are to produce the multi-function waveforms.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and. changes may be made without departing from the scope of this disclosure. This Detailed Description, therefore, is not to be taken in a limiting sense, and the scope of various embodiments is defined only by the appended claims, along with the full range of equivalents to which such claims are entitled.

What is claimed is:

1. A device for creating multi-function waveforms comprising:
    input circuitry to receive parameters indicating respective frequencies and codes for the multi-function waveforms;
    one or more memories coupled to the input circuitry, the one or more memories including the respective frequencies and codes for code division multiple access (CDMA); and
    waveform management circuitry configured to:
    produce a series of values based on a frequency and code of the frequencies and codes, respectively; and
    refine the series of values to reduce a cost associated with producing the series of values; and
    a transceiver to produce a multi-function waveform of the multi-function waveforms, based on the refined series of values, that simultaneously communicates data to another device and performs another, different function.

2. The device of claim 1, wherein the cost includes a combination of two or more of a peak to average power ratio of the series of values, a side lobe level of the series of values, and a difference between a projection of the multi-function waveform in to signal space and a desired signal vector.

3. The device of claim 2, wherein the cost includes a sum of all three of the peak to average power ratio of the series of values, the side lobe level of the series of values, and the difference between a projection of the multi-function waveform in to signal space and a desired signal vector.

4. The device of claim 3, wherein the waveform management circuitry is configured to refine the series of values by performing one of a spectrally efficient, iterative technique or a spectrally efficient, accelerated iterative technique.

5. The device of claim 4, wherein the waveform management circuitry is further to determine a number of iterations to perform in refining the series of values based on the technique used to refine the series of values.

6. The device of claim 5, wherein the determined number of iterations is fewer for a spectrally efficient, accelerated iterative technique than for a spectrally efficient, iterative technique.

7. The device of claim 6, wherein the waveform management circuitry is further configured to estimate a processing latency associated with the node producing the waveform based on the refined series of values.

8. The device of claim 7, wherein the one or more memories is further to store a schedule indicating times at which nodes of a network of nodes are to produce the multi-function waveforms, and the waveform management circuitry is further to determine whether the estimated processing circuitry creates a conflict in the schedule.

9. The device of claim 8, wherein the each of the average power ratio of the series of values, the side lobe level of the series of values, and the difference between a projection of the waveform in to signal space and a desired signal vector are multiplied by a respective weight.

10. A method for creating multi-function waveforms comprising:
  receiving, by input circuitry, parameters indicating respective frequencies and codes for the multi-function waveforms;
  producing, by waveform management circuitry, a series of values based on a frequency and code of the frequencies and codes, respectively;
  refining, by the waveform management circuitry, the series of values to reduce a cost associated with producing the series of values; and
  providing, by a transceiver coupled to the waveform management circuitry, a multi-function waveform of the multi-function waveforms, based on the refined series of values, that simultaneously communicates data to another device and performs another, different function.

11. The method of claim 10, wherein the cost includes a combination of two or more of a peak to average power ratio of the series of values, a side lobe level of the series of values, and a difference between a projection of the multi-function waveform in to signal space and a desired signal vector.

12. The method of claim 11, wherein the cost includes a sum of all three of the peak to average power ratio of the series of values, the side lobe level of the series of values, and the difference between a projection of the multi-function waveform in to signal space and a desired signal vector.

13. The method of claim 12, wherein refining the series of values includes performing one of a spectrally efficient, iterative technique or a spectrally efficient, accelerated iterative technique.

14. The method of claim 13, further comprising determining a number of iterations to perform in refining the series of values based on the technique used to refine the series of values.

15. The method of claim 14, wherein the determined number of iterations is fewer for a spectrally efficient, accelerated iterative technique than for a spectrally efficient, iterative technique.

16. The method of claim 15, further comprising estimating a processing latency associated with the node producing the waveform based on the refined series of values.

17. The method of claim 16, further comprising determining whether the estimated processing latency creates a conflict in a schedule indicating times at which nodes of a network of nodes are to produce the multi-function waveforms.

18. The method of claim 17, wherein the each of the average power ratio of the series of values, the side lobe level of the series of values, and the difference between a projection of the waveform in to signal space and a desired signal vector are multiplied by a respective weight.

19. A non-transitory machine-readable medium including instructions stored thereon which, when executed by a machine, cause the machine to perform operations comprising:
  receiving, from scheduling circuitry, parameters indicating respective frequencies and codes for a multi-function waveform that simultaneously communicates data to another device and performs another, different function;
  producing a series of values based on a frequency and code of the frequencies and codes, respectively;
  refining the series of values to reduce a cost associated with producing the series of values; and
  providing the multi-function waveform based on the refined series of values.

20. The non-transitory machine-readable medium of claim 19, wherein the cost includes a peak to average power ratio of the series of values, a side lobe level of the series of values, and a difference between a projection of the multi-function waveform in to signal space and a desired signal vector.

* * * * *